(12) United States Patent
Liu et al.

(10) Patent No.: US 10,867,719 B2
(45) Date of Patent: Dec. 15, 2020

(54) ENHANCING PERFORMANCE STABILITY OF ELECTROACTIVE POLYMERS BY VAPOR-DEPOSITED ORGANIC NETWORKS

(71) Applicant: Massachusetts Institute of Technology, Cambridge, MA (US)

(72) Inventors: Andong Liu, Brookline, MA (US); Karen K. Gleason, Cambridge, MA (US); T. Alan Hatton, Sudbury, MA (US); Xianwen Mao, Ithaca, NY (US)

(73) Assignee: Massachusetts Institute of Technology, Cambridge, MA (US)

( * ) Notice: Subject to any disclaimer, the term of this patent is extended or adjusted under 35 U.S.C. 154(b) by 49 days.

(21) Appl. No.: 16/036,010

(22) Filed: Jul. 16, 2018

(65) Prior Publication Data

US 2019/0055371 A1 Feb. 21, 2019

Related U.S. Application Data (60) Provisional application No. 62/533,344, filed on Jul. 17, 2017.

(51) Int. Cl.
| | | |
|---|---|---|
| *H01B 1/12* | (2006.01) | |
| *H01L 51/00* | (2006.01) | |
| *B05D 1/00* | (2006.01) | |
| *H01G 11/48* | (2013.01) | |
| *H01G 11/56* | (2013.01) | |
| *H01G 11/84* | (2013.01) | |
| *C08F 120/20* | (2006.01) | |
| *H01B 1/00* | (2006.01) | |
| *C08G 61/00* | (2006.01) | |
| *C08G 61/12* | (2006.01) | |
| *H01L 51/42* | (2006.01) | |

(52) U.S. Cl.
CPC ........... *H01B 1/127* (2013.01); *B05D 1/60* (2013.01); *C08F 120/20* (2013.01); *H01B 1/00* (2013.01); *H01B 1/124* (2013.01); *H01G 11/48* (2013.01); *H01G 11/56* (2013.01); *H01G 11/84* (2013.01); *H01L 51/0035* (2013.01); *C08G 61/00* (2013.01); *C08G 61/124* (2013.01); *C08G 61/126* (2013.01); *C08G 2261/19* (2013.01); *C08G 2261/3221* (2013.01); *C08G 2261/3223* (2013.01); *H01L 51/4253* (2013.01)

(58) Field of Classification Search
CPC . H01B 1/00; H01B 1/12; H01B 1/122; H01B 1/124; H01B 1/127; H01B 1/20; H01G 11/40; H01G 11/42; H01G 11/48; H01G 11/54; H01G 11/56; C08G 61/00; C08G 61/123; C08G 61/124; C08G 61/126; C08G 2261/18; C08G 2261/19; C08G 2261/20; C08G 2261/3221; C08G 2261/3223; C08G 2261/1529; H01L 51/0035; H01L 51/4353; B05D 1/60; C08F 120/20
See application file for complete search history.

(56) References Cited

U.S. PATENT DOCUMENTS

| | | | | |
|---|---|---|---|---|
| 4,936,956 | A * | 6/1990 | Wrighton | ............... B82Y 10/00 |
| | | | | 204/403.14 |
| 8,865,789 | B2 * | 10/2014 | Yao | ........................ G02B 1/043 |
| | | | | 523/107 |
| 2005/0107872 | A1 * | 5/2005 | Mensah | .................. A61L 27/16 |
| | | | | 623/2.14 |
| 2010/0255303 | A1 * | 10/2010 | Wardle | ................... B82Y 10/00 |
| | | | | 428/378 |
| 2011/0087315 | A1 * | 4/2011 | Richardson-Burns | ...................... |
| | | | | A61B 5/0408 |
| | | | | 607/116 |
| 2013/0171338 | A1 | 7/2013 | Pan et al. | |

FOREIGN PATENT DOCUMENTS

| | | |
|---|---|---|
| WO | WO-00/02949 A1 | 1/2000 |
| WO | WO-2009/112382 A1 | 9/2009 |
| WO | WO-2010/120273 A2 | 10/2010 |

OTHER PUBLICATIONS

Lee et al. ("Poly(2-hydroxyethyl methacrylate-co-sulfobetaine)s hydrogels: 3. Synthesis and swelling behaviors of the [2-hydroxyethyl methacrylate-co-N,N'-dimethyl (acrylamide propyl) ammonium propane sulfonate] hydrogels," Polymer Gels and Networks, 6, pp. 493-511). (Year: 1998).*
International Search Report and Written Opinion for International Application No. PCT/US2018/042231 dated Oct. 22, 2018.
Yague et al., "Systematic control of mesh size in hydrogels by initiated chemical vapor deposition," Soft Matter, 8:2890-2894 (2012).

* cited by examiner

*Primary Examiner* — Matthew R Diaz
(74) *Attorney, Agent, or Firm* — Foley Hoag LLP; Dana M. Gordon; Lawrence P. Tardibono (57) ABSTRACT

Disclosed are compositions of electroactive polymers (EAPs) having improved performance stability. In the EAP compositions, a cross-linked polymer is deposited onto the surface of the EAP by vapor-deposition methods. Upon contact with an aqueous solution (e.g., an aqueous electrolyte solution), the vapor-deposited polymeric network becomes a hydrogel that encapsulates the EAPs. By modulating precursors and vapor deposition conditions, the mesh size of the resultant hydrogel coatings can be controlled to accommodate the key species that interact with the EAPs.

14 Claims, 8 Drawing Sheets

| Ion | Hydrated ion size (nm) |
|---|---|
| $H^+$ | 0.280 |
| $K^+$ | 0.331 |
| $NH_4^+$ | 0.331 |
| $Na^+$ | 0.358 |
| $Li^+$ | 0.382 |
| $Ba^{2+}$ | 0.404 |
| $Ca^{2+}$ | 0.412 |
| $Mg^{2+}$ | 0.428 |
| $OH^-$ | 0.300 |
| $Cl^-$ | 0.332 |
| $NO_3^-$ | 0.335 |
| $ClO_4^-$ | 0.338 |
| $PO_4^{3-}$ | 0.339 |
| $SO_4^{2-}$ | 0.379 |
| $CO_3^{2-}$ | 0.394 |

FIGURE 8

ENHANCING PERFORMANCE STABILITY OF ELECTROACTIVE POLYMERS BY VAPOR-DEPOSITED ORGANIC NETWORKS

RELATED APPLICATIONS

This application claims the benefit of priority to U.S. Provisional Patent Application Ser. No. 62/533,344, filed Jul. 17, 2017.

GOVERNMENT SUPPORT

This invention was made with Government support under Grant No. N00014-13-1-0466 awarded by the Office of Naval Research. The Government has certain rights in the invention.

BACKGROUND OF THE INVENTION

Performance stability of electroactive polymer (EAPs) remains one of the greatest and long-standing challenges with regard to EAP-based technologies for a myriad of energy, biomedical, and environmental applications. The performance instability of EAPs originates from their structural alteration under repeated charge-discharge cycling and/or flexing. In this work, a conceptually new "soft confinement" strategy to enhance EAPs' performance stability, including cyclic and mechanical, by using rationally designed, vapor-deposited organic networks is presented. These chemically crosslinked networks, when contacting electrolyte solution, turn into ultrathin, elastic hydrogel coatings that encapsulate conformally the EAPs' micro/nanostructures. Such hydrogel coatings allow easy passage of ions that intercalate with EAPs, while simultaneously mitigating the structural pulverization of the EAPs and/or their detachment from substrates. Fundamentally distinct from extensively studied "scaffolding" or "synthetic" approaches to stabilizing EAPs, this soft confinement strategy relies on a post-modification step completely decoupled from the EAP synthesis/fabrication, and enjoys the unique advantage of substrate-independency. Hence, this strategy is universally applicable to various types of electroactive polymers. The proposed stability enhancement strategy has been demonstrated to be effective for a range of EAP systems with differing chemical and morphological characteristics under various testing conditions (repeated charging/discharging, bending and twisting).

The growing research interest in electroactive polymers (EAPs) stems from their key roles in diverse applications, such as energy storage and conversion,[1-4] drug delivery and monitoring,[5, 6] organic (bio)electronics development,[7, 8] neural interface engineering,[9, 10] and chemical and environmental separations.[11-13] Performance stability remains one of the greatest and long-standing challenges with regard to EAP-based technologies, particularly with prolonged charge/discharge cycling and/or the application of mechanical stresses. Enhanced stability would enable practical long-term operation, as well as meet the increasing demand for flexible electronic devices.[14-16] Possible mechanisms causing the cycling instability of EAPs include structural pulverization due to repeated swelling and shrinkage of polymer backbones, and collapse of initially present ion channels resulting in difficulty of subsequent re-doping.[14, 17-20] A widely adopted approach to enhancing EAP stability is integration of the EAPs with conductive scaffolds, such as porous graphite foams,[21] carbon nanotube sponges,[22] nickel foams,[23] and partially exfoliated graphite.[18] These scaffolds are usually porous and dimensionally stable, and thus act as robust supports for EAP films to reduce their structural alteration. Such a "scaffolding" approach relies on effective hybridization of the EAP with the underlying conductive substrate, a non-trivial task. The integration process often requires judicious surface modification of the scaffold materials to create specific interactions (e.g., covalent bonding, π-π stacking) with the EAP, and a lengthy screening process to determine the reaction conditions for the growth of a certain EAP on the scaffold. A few less common methods based on deliberate synthetic strategies for improving EAP stability have also been demonstrated, such as creation of superamolecular structures,[24] synthesis of hyperbranched EAPs,[25] and dopant/EAP engineering.[26, 27] These scaffolding and synthetic approaches have shown great promise when applied to certain types of EAP systems, but are highly dependent on the chemical nature of the EAP. Hence, an optimized reaction condition usually applies to only one specific EAP. In addition, morphology control of the EAP is not decoupled from the integration or synthesis process: the scaffolding or synthetic approach that results in enhanced stability could also yield an undesired morphology with compromised electrochemical properties (e.g., lower energy density, lower sensitivity, and diminished functionalities).

SUMMARY OF THE INVENTION

In certain aspects, the invention provides a composition, comprising an electroactive polymer; and a crosslinked polymer;
wherein the crosslinked polymer is in contact with a surface of the electroactive polymer; and the crosslinked polymer forms a hydrogel on contact with an aqueous solution.

In further aspects, the invention provides a supercapacitor comprising a composition of the invention.

In further aspects, the present invention provides a method, comprising the step of:
depositing a crosslinked polymer on a surface of an electroactive polymer; thereby forming a modified electroactive polymer;
wherein the crosslinked polymer forms a hydrogel on contact with an aqueous electrolyte solution; and the performance stability of the modified electroactive polymer is improved relative to the performance stability of the electroactive polymer.

BRIEF DESCRIPTION OF THE DRAWINGS

FIG. 1 consists of panels (a)-(i). Panel (a) shows a schematic illustration of the "soft confinement" concept. An iCVD-synthesized polymer network is deposited conformally on EAP microstructures. Here P(HEMA-co-DEGDVE) (or PHEMAx) and PVF were used as the model polymer network and EAP, respectively. Panels (b-d) are representative SEM images of (b) bare CP (c) PVF/CP and (d) PVF-h/CP (3 h iCVD treatment). Panel (e) shows XPS spectra of bare CP, PVF/CP and PVF-h/CP (3 h iCVD treatment). Panels (f-h) show: (f) Capacity retention versus the number of CV cycles, (g) the fifth CV curves, and (h) specific capacity versus scan rate for PVF/CP (untreated) and PVF-h/CP with 0.5, 1.5, 3 and 4.5 h iCVD treatments. CV was performed at 0.1 V/s in 0.5 M $NaClO_4$ using a three-electrode configuration. Panel (i) shows simulated $\Delta E_p$ values versus scan rate with different R ($=D_{ct}^{PVF}/D_{ct}^{PVF\text{-}h}$)

values (heat map), overlaid with the experimentally measured $\Delta E_p$ values (black symbols).

FIG. 2 consists of panels (a)-(i). Panels (a) and (b) show representative SEM images of (a) PPY/CP and (b) PPY-h/CP. Panel (c) shows XPS spectra of PPY/CP and PPY-h/CP. Panel (d) graphs the capacity retention versus number of CV cycles for PPY/CP and PPY-h/CP. CV was performed at 0.1 V/s in 0.5 M $NaClO_4$ using a three-electrode configuration. Panel (e) is a representative SEM image of nPPY. Inset: photographs of freestanding nPPY pellets with a diameter of ~9 mm. Panel (f) is a representative SEM image of nPPY-h. Panel (g) contains XPS spectra of nPPY and nPPY-h. Panel (h) shows capacity retention versus number of CV cycles for nPPY and nPPY-h. CV was performed at 0.1 V/s in 0.5 M $NaClO_4$ using a three-electrode configuration. Panel (i) is a summary of rate performance (left panel, measured by CV and GV) and $R_s$ values (right panel, measured by EIS) for PPY and nPPY without (blue bars) and with iCVD treatment (red bars). Rate performance measured by CV or GV measurements was defined as the ratio between the specific capacitance obtained at 0.2 V/s or ~5 A/g and that obtained at 0.01 V/s or ~1 A/g. The PHEMAx coatings of PPY-h/CP and nPPY-h were prepared by a 3 h iCVD treatment.

FIG. 3 consists of panels (a)-(h). Panel (a) is a schematic illustration of the bending test condition. Photograph shows an example of a bent electrode. Panel (b) shows capacity retention versus number of bending cycles for PVF/CC, PVF-h/CC, PPY/CC, and PPY-h/CC. Specific capacities were measured by CV at 0.15 V/s in 0.5 M $NaClO_4$ using a three-electrode configuration. Panel (c) is a schematic illustration of the twisting test conditions. Photograph shows an example of a twisted electrode. Panel (d) graphs capacity retention versus number of twisting cycles for PVF/CC, PVF-h/CC, PPY/CC, and PPY-h/CC. Specific capacities were measured by CV at 0.15 V/s in 0.5 M $NaClO_4$ using a three-electrode configuration. Panel (e) graphs capacity retention versus number of bending or twisting cycles for PVFCNT/CC and PVFCNT-h/CC. Panel (f) contains CV curves (0.05 V/s) obtained with a symmetric PEDOT supercapacitor, symmetric PVFCNT supercapacitor, ASC and ASC-h. Panel (g) contains Ragone plots for the symmetric PEDOT, PVFCNT supercapacitors, ASC and ASC-h. Panel (h) depicts a comparison of capacity retention between ASC and ASC-h when subject to 10000 GV cycles, 4000 bending cycles, and 800 twisting cycles. GV measurements were performed at 1.2 A/g for ASC and 1.4 A/g for ASC-h. For bending and twisting tests, the specific capacities were determined by CV measurements at 0.1 V/s. The PHEMAx coatings of PVF-h/CC, PPY-h/CC, PVF-CNT-h/CC and ASC-h were prepared by a 3 h iCVD treatment.

DETAILED DESCRIPTION OF THE INVENTION

The present invention is based on a conceptually new strategy to enhance EAP performance stability using a polymer network that provides "soft confinement" for an EAP system. The EAP systems of the invention, whose microstructure is confined conformally by an ultrathin elastic polymer network, exhibit increased morphological integrity, leading to low extents of structural pulverization and ion channel collapse. In contrast to the scaffolding and synthetic approaches studied extensively in the past,[18, 21-27] this soft confinement approach is applicable independently of the surface chemistry and morphology of the EAPs to be stabilized, and hence can be used flexibly in various types of EAP systems with different structures for a range of applications.

To achieve effective stability enhancement without compromising the desired electrochemical functionalities of EAPs, the material system providing the soft confinement (i) completely and conformally coats the interfaces of micro-/nanostructured EAPs without blocking the structures/pores, (ii) tolerates the volumetric alteration of EAPs without being mechanically degraded itself, and (iii) allows easy passage of electrolyte ions for subsequent doping/de-doping of the inner EAPs. The hydrogel coating described herein meets all the preceding requirements for soft confinement, and may be formed in an aqueous electrolyte by the swelling of a polymer network synthesized via a non-destructive gas-phase process, initiated chemical vapor deposition (iCVD).

The methods of enhancing EAP stability provided by the present invention exhibits many unique advantages. First, the coating process using iCVD does not rely on the surface energy of the EAP. Nor does it rely on the surface chemistries of, or specific interactions with, the EAP, and thus is universally applicable to EAPs of various chemical natures. Furthermore, the polymer coating and the resulting hydrogel thin-film conform to a structured interface and therefore is applicable to highly porous, nanostructured EAP systems, which are of enormous significance for various electrochemical applications. This is because iCVD allows the conformal modification of pores with diameters down to sub-100 nm, with exquisite control of the coating thickness.[28, 29] Additionally, the coating process using vapor phase precursors is solvent-free and thermally non-destructive, thus avoiding common issues associated with solution-based modifications such as polymer leaching and deformation. Finally, yet importantly, the iCVD technique has proven scalability for potential commercialization; large-area-batch (>1 m diameter) and roll-to-roll systems have been utilized for manufacture.[30]

Described herein is a "soft confinement" approach for improving EAP performance stability by using iCVD-synthesized PHEMAx films that, when in contact with electrolyte solutions, become hydrogel coatings encapsulating the EAP microstructures. Fundamentally distinct from commonly used "scaffolding" or "synthetic" approaches, this strategy enjoys the unique advantage of substrate-independency, and hence is universally applicable to EAPs of different chemical characteristics and morphologies. As described herein, this strategy leads to remarkably enhanced performance stabilities of different types of EAP systems, under various testing conditions, including repeated charging/discharging, bending and twisting. This soft confinement approach can be used in combination with other EAP stabilization methods, taking the performance stability of EAPs to a higher level. Furthermore, this strategy could be extended to many other EAP applications beyond energy storage, where the stabilization and reusability of EAPs are crucial for realizing practical long-term operations. Such applications may include EAP-based electrochemically mediated sensing, catalysis and separations, since the hydrogel coatings can be rationally engineered by modulating iCVD precursors and conditions for tunable chemical compositions and mesh sizes. The engineered coating could accommodate the key species that interact with the EAPs for these applications, such as target biomolecules to be detected for sensing purposes, reactants of interest in catalytic cycles, or pollutants to be removed in separation processes.

In certain embodiments, the invention provides a composition, comprising an electroactive polymer; and a crosslinked polymer;
wherein the crosslinked polymer is in contact with a surface of the electroactive polymer; and the crosslinked polymer forms a hydrogel on contact with an aqueous solution.

In certain embodiments, the crosslinked polymer forms a hydrogel on contact with an aqueous electrolyte solution.

In certain such embodiments, the electroactive polymer is a redox polymer.

Redox polymers may comprise an unconjugated backbone, a pendent redox-active group, or both. Redox active groups include, but are not limited to ruthenium complexes, ferrocene, and ferrocene with attached functional groups (such as ferrocenyl methanol, ferrocenyl ethanol, and methyl ferrocene). In further embodiments, a redox polymer comprises copolymer, such as a ferrocene and ruthenium copolymer.

In certain embodiments, the electroactive polymer comprises an unconjugated backbone. In certain embodiments, the electroactive polymer is poly(vinylferrocene) (PVF).

Alternatively, the electroactive polymer may comprise an intrinsically conducting polymer (ICP).

In certain embodiments, the electroactive polymer comprises a conjugated backbone.

Intrinsically conducting polymers may include: polythiophene, polyaniline, or polypyrrole (PPY). In other embodiments, ICP is an ICP hybrid in which, for example, aniline and pyrrole are copolymerized.

In certain embodiments, the electroactive polymer is polypyrrole (PPY).

In certain embodiments, electroactive polymer is configured as a sheet, a tube, or as a layer deposited on carbon paper or a carbon cloth substrate.

In some embodiments, the electroactive polymer is configured as a polymer composites, such as polymer with carbon nanotubes, polymer with graphene sheets, polymer with Au nanoparticles.

In some embodiments, the electroactive polymer is configured as a nanocomposite; that is, the EAP is combined with nanosized or micro-sized objects. The soft confinement strategy described herein can be also applied to such polymer composites to enhance their cycling and mechanical stability.

In certain embodiments, the electroactive polymer comprises a plurality of microstructures or a plurality of nanostructures.

In some embodiments of the composition of the invention, the crosslinked polymer comprises a first polymeric unit and a second polymeric unit.

For example, the first polymeric unit may be 2-hydroxyethyl methacrylate. The second polymeric unit may be di(ethylene glycol) divinyl ether.

In certain embodiments, the crosslinked polymer coats the surface of the electroactive polymer.

In certain embodiments, the hydrogel coats on the surface of the electroactive polymer.

The compositions of the invention may be made in part through an initiated chemical vapor deposition process, which facilitates control over various parameters of the composition, such as mesh size. Thus, in certain embodiments, the crosslinked polymer is deposited on the surface of the electroactive polymer via an initiated chemical vapor deposition process.

In certain embodiments, the initiated chemical vapor deposition process lasts about 15 minutes to about 6 hours. The process may alternatively last about 30 minutes to about 6 hours, about 15 minutes to about 5.5 hours, about 30 minutes to about 5.5 hours, about 30 minutes to about 5 hours, about 1 hour to about 5 hours, about 30 minutes to about 5 hours, about 1 hour to about 4.5 hours, about 30 minutes to about 4.5 hours, about 1 hour to about 4 hours, about 30 minutes to about 4 hours, or about 1 hour to about 3 hours. In some embodiments, the initiated chemical vapor deposition process lasts about 1 hour to about 3 hours.

In certain embodiments, the hydrogel is permeable to electrolyte ions.

In some embodiments, the crosslinked polymer has a swelling ratio of 1.25 to 1.75. In some embodiments, the crosslinked polymer has a swelling ratio of 1.3 to 1.7, of 1.3 to 1.65, of 1.35 to 1.65, of 1.4 to 1.65, of 1.4 to 1.6, of 1.35 to 1.55, of 1.4 to 1.55, or of 1.4 to 1.5. In certain embodiments, the crosslinked polymer has a swelling ratio of 1.4.

The hydrogel coating in the compositions of the invention improves the stability of the electroactive polymer component. In certain embodiments, the electrochemical stability of the electroactive polymer is improved. For example, this improved stability may be exhibited through measuring capacity retention after electrochemical cycles (see, e.g., Example 10). Accordingly, in certain embodiments of the invention, after at least 8000 electrochemical cycles the capacity retention of the composition is about 50% to about 100%. In certain embodiments, after at least 8000 electrochemical cycles the capacity retention of the composition is about 60%, about 70%, or about 80% to about 100%. Preferably, after at least 8000 electrochemical cycles the capacity retention of the composition is about 90% to about 100%.

The hydrogel coating can improve the capacity retention of the electroactive polymer after an even higher number of electrochemical cycles. For example, in some embodiments, after at least 15,000 electrochemical cycles the capacity retention of the composition is about 50% to about 100%. In certain embodiments, after at least 15,000 electrochemical cycles the capacity retention of the composition is about 60%, about 70%, or about 80% to about 100%. Preferably, after at least 15,000 electrochemical cycles the capacity retention of the composition is about 90% to about 100%.

In some embodiments, the electrochemical cycle is a cyclic voltammetry cycle.

In alternative embodiments, the electrochemical cycle is a galvanostatic cycle.

In certain embodiments, the crosslinked polymer coating increasing the hydrophilicity of the electroactive polymer. A water contact angle is a measurement of hydrophilicity. Thus, in certain embodiments, the composition has a water contact angle of about 10° to about 60°, about 10° to about 50°, about 10° to about 40°, about 10° to about 30°, about 15° to about 30°, about 15° to about 25°, or about 20°.

In certain embodiments, crosslinked polymer coating improves the mechanical stability of the electroactive polymer. Mechanical stability can be affected by any number of mechanical operations, such as bending the composition, twisting the composition, or a combination thereof.

Thus, in certain embodiments of the composition of the invention, having improved mechanical stability, after at least 1000 bending cycles the capacity retention of the composition is from about 70% to about 100%. In certain embodiments, after at least 1000 bending cycles a capacity retention of the composition is from about 80% to about 100%, or is from about 90% to about 100%. Higher numbers of bending cycles are also well tolerated. In certain embodiments, after at least 2000 bending cycles a capacity retention of the composition is from about 70% to about 100%, from about 80% to about 100%, or from about 90% to about 100%.

In further embodiments, after at least 500 twisting cycles the capacity retention of the composition is from about 70% to about 100%, from about 80% to about 100%, or from about 90% to about 100%.

The compositions of the invention are useful in numerous applications such as electrochemically mediated sensing, catalysis and separations, and energy storage.

Accordingly, in certain embodiments, the invention provides a supercapacitor, comprising a composition of the invention. In certain embodiments, the supercapacitor further comprises a negative electrode.

The present invention also provides methods of stabilizing electroactive polymers.

Accordingly, in certain embodiments, the invention provides a method, comprising the step of:
depositing a crosslinked polymer on a surface of an electroactive polymer; thereby forming a modified electroactive polymer;
wherein the crosslinked polymer forms a hydrogel on contact with an aqueous electrolyte solution; and the performance stability of the modified electroactive polymer is improved relative to the performance stability of the electroactive polymer.

In certain embodiments, the crosslinked polymer is deposited on the surface of the electroactive polymer via an initiated chemical vapor deposition (iCVD) process.

In certain embodiments, the duration of the initiated chemical vapor deposition process is about 15 minutes to about 6 hours. The duration of the process may be about 30 minutes to about 6 hours, about 15 minutes to about 5.5 hours, about 30 minutes to about 5.5 hours, about 30 minutes to about 5 hours, about 1 hour to about 5 hours, about 30 minutes to about 5 hours, about 1 hour to about 4.5 hours, about 30 minutes to about 4.5 hours, about 1 hour to about 4 hours, about 30 minutes to about 4 hours, or about 1 hour to about 3 hours. In some embodiments, the duration is about 1 hour to about 3 hours.

In certain embodiments, the crosslinked polymer coats the surface of the electroactive polymer.

In certain embodiments, the hydrogel coats the surface of the electroactive polymer.

In certain embodiments, the electroactive polymer is a redox polymer. In certain embodiments, the electroactive polymer comprises an unconjugated backbone. In certain embodiments, the electroactive polymer is poly(vinylferrocene) (PVF).

Alternatively, the electroactive polymer may comprise an intrinsically conducting polymer (ICP). In certain embodiments, the electroactive polymer comprises a conjugated backbone. Preferably, the electroactive polymer may be polypyrrole (PPY).

In certain embodiments, the electroactive polymer is configured as a sheet, a tube, or as a layer deposited on carbon paper or a carbon cloth substrate.

In certain embodiments, the electroactive polymer comprises a plurality of microstructures or a plurality of nanostructures.

In some embodiments, the crosslinked polymer comprises a first polymeric unit and a second polymeric unit.

For example, the first polymeric unit may be 2-hydroxyethyl methacrylate. The second polymeric unit may be di(ethylene glycol) divinyl ether.

In certain embodiments, wherein the cycling stability of the modified electroactive polymer is improved relative to the cycling stability of the electroactive polymer.

In certain embodiments, the mechanical stability of the modified electroactive polymer is improved relative to the mechanical stability of the electroactive polymer.

EXAMPLES

Materials

Polyvinylferrocene (PVF, molecular weight=50,000 g mol$^{-1}$) was obtained from Polysciences. Pyrrole, sodium perchlorate, tetrabutylammonium (TBA) perchlorate, chloroform, ethanol, sulfuric acid, tert-butyl peroxide (TBPO) (98%), 2-hydroxyethyl methacrylate (HEMA) (≥99%), di(ethylene glycol) divinyl ether (DEGDVE) (99%), 3,4- ethylenedioxythiophene (EDOT) (97%), polyvinyl alcohol (PVA, molecular weight=61,000 g mol$^{-1}$), multi-walled carbon nanotubes (MWCNTs) with a diameter of 6 to 9 nm and purity of 95% were obtained from Sigma Aldrich. A platinum wire auxiliary electrode and an Ag/AgCl (3 M NaCl) reference electrode were purchased from BASi. All reagents were used as received throughout the study, without further purification or chemical modification unless otherwise noted.

General Instrumentation

Scanning electron microscopy (SEM) (JEOL-6010LA) was used for the morphological study of various EAP-based electrode systems. Samples for SEM were sputter-coated with a 10 nm layer of gold/palladium using a Desk II cold sputter/etch unit (Denton Vacuum LLC). X-ray photoelectron spectroscopy (XPS, Kratos Analytical) measurements were recorded with a Kratos Axis Ultra instrument equipped with a monochromatic Al Kα source operated at 150 W. The analyzer angle was set at 90 degrees with respect to the specimen surface. Survey scan spectra were recorded over a binding energy range of 0-800 eV and pass energy of 160 eV. Energy calibration for the XPS survey scans was performed by setting the carbon line to 284.0 eV. To obtain the O/C ratio, the XPS survey scans were analyzed using CasaXPS software (Shirley background). Variable-angle ellipsometric spectroscopy (VASE, M-2000, J. A. Woollam) was used to measure the dry and swollen film thicknesses at the angle incidence of 70°. Water contact angle measurements were conducted for the iCVD coating on silicon wafer substrate with a goniometer equipped with an automatic dispenser (Rame-Hart, model 500). The static sessile drop method was applied. A water volume of 2 μL was deposited on the sample surface and the contact angle was determined based on the high resolution image. FTIR measurement were performed on a Nicolet iS50 FT-IR Spectrometer (Thermo Scientific) equipped with a MCT detector and KBr beam splitter in normal transmission mode. The spectra of iCVD coated wafers were collected, and those of uncoated silicon wafers were subtracted as background. Measurements were taken over 350-3500 cm$^{-1}$ with a resolution of 4 cm$^{-1}$ and averaged over 256 scans to improve signal-to-noise ratio. All spectra were baseline-corrected. The surface area of the porous carbon paper substrate was determined from nitrogen adsorption isotherm (ASAP2020, Micromeritics) by means of the Brunauer-Emmett-Teller (BET) method. Thermogravimetric analysis (TGA) experiments were carried out using a TA Q50 instrument. Before the TGA experiment, the sample was dried in a vacuum oven at 50° C. for 12 hr. Then the sample was placed into a TGA pan and stabilized at 30° C. for 30 min, and the temperature was increased to 800° C. at a heating rate of 5° C./min. Electrochemical characterization was performed using a VersaSTAT4 potentiostat with the VersaStudio software. Compressive bending tests were performed using an ADMET micro EP miniature testing machine. The machine was programed to repeat the bending for a specified number of cycles. Twisting tests were carried out using a controllable electrical drilling machine (Mile-X) to rotate the flexible electrodes at one end with the other end immobilized.

Example 1: Electrochemical Deposition of EAPs onto CP or CC Substrates

The typical procedure used to perform electrochemical deposition of EAPs onto carbon substrates is as follows. The PVF/CP or PVF/CC electrode system was prepared by applying a potential of 0.8 V versus Ag/AgCl to the carbon paper (CP) or carbon cloth (CC) substrate with a nominal surface area of 1 cm$^2$ for 10 min in 5 mL chloroform solution containing 10 mg/mL PVF and 0.1M tetrabutylammonium perchlorate. The affinity of ferrocene moieties in PVF for hydrophobic organic solvents (e.g., chloroform) is reduced upon oxidation. Therefore, PVF initially soluble in chloroform became solvophobic and subsequently precipitated onto the fiber when it was oxidized at the fiber surface. The PPY/CP or PPY/CC electrode system was prepared by electrochemical polymerization of pyrrole through application of a potential of 0.6 V versus Ag/AgCl to the CP or CC substrate for 5 min in 5 mL water containing 0.1 M pyrrole and 0.1 M sodium perchlorate. The PVFCNT/CC electrode system was prepared by repeating the following electrochemical deposition for several times: application of a potential of 0.8 V versus Ag/AgCl to the CC substrate with a nominal surface area of 1 cm$^2$ for 2 min in 5 mL chloroform solution containing 10 mg/mL PVF, 2 mg/mL MWCNTs, and 0.1 M tetrabutylammonium perchlorate. Typically, the deposition process was repeated for three to four times, and between each deposition cyclic voltammetric measurements were performed to track the quantity of PVF deposited. Note that MWCNTs and PVF formed stable suspensions in chloroform after sonication for 45 min. [Mao, et al. *Langmuir* 2013, 29, 9626].

Example 2: Synthesis of PHEMAx by Initiated Chemical Vapor Deposition (iCVD)

The iCVD process and its reactor configuration have been described in detail. J. L. Yague, K. K. Gleason, *Soft Matter* 2012, 8, 2890. PHEMAx was synthesized and simultaneously deposited onto porous EAP electrodes via iCVD. A silicon wafer was also placed in the reactor to harvest iCVD-deposited polymer, for the purpose of in situ thickness monitoring and polymer characterization. The monomer HEMA (heated at 75° C.) was delivered in the vapor phase introduced to the iCVD reactor at 0.45 sccm, together with the crosslinker DEGDVE (heated at 60° C.) at 0.3 sccm. The vapor of initiator TBPO was metered at 1.0 sccm. The reactor pressure was controlled at 300 mTorr by a throttle valve. The stage temperature was back-cooled and maintained at 40° C. The filament temperature was heated resistively at 250° C. For PVF/CP electrodes, four treatment times (0.5, 1.5, 3, and 4.5 h) were investigated. For all other electrodes, 3 h of iCVD treatment was used.

Example 3: Estimation of the Hydrogel Mesh Size

To estimate the thickness of dry films, the ellipsometric data were obtained directly and fit to the Cauchy-Urbach model. For swollen thickness measurement, a liquid cell accessory (J. A. Woollam) was used. The cell was clamped over the sample, and water was injected to the liquid-tight cell. A correction was applied to account for the effect from the cell windows. The optical properties of water were incorporated into the fitting of ellipsometric data to the Cauchy-Urbach model. The model and method to calculate mesh sizes of hydrogels are described in detail [S. G. Im, K. K. Gleason, *Macromolecules* 2007, 40, 6552].

Example 4: Synthesis of Nanostructured PPY Hydrogels

In a typical synthesis, 6.3 mmol pyrrole was dissolved in 3 mL water/ethanol (v/v 1:1) mixed solvent (solution A). Solution B was prepared by dissolving 6.3 mmol FeCl$_3$ and 6.3 mmol NaNO$_3$ in 3 mL water. Next solution A and solution B were cooled to 0-4° C., and then mixed under vigorous agitation. The mixture was stored at room temperature for 30 days and the resulting PPY hydrogel was purified by immersion in a water/ethanol mixed solvent under stirring for 24 h. Finally, the dehydrated PPY hydrogel was obtained by allowing it to dry in a vacuum oven at 60° C. for 48 h.

Example 5: Synthesis of PEDOT by Oxidative Chemical Vapor Deposition (oCVD)

The oCVD process procedure and the reactor configuration were described in detail [S. G. Im, K. K. Gleason, *Macromolecules* 2007, 40, 6552]. Briefly, 3,4-ethylenedioxythiophene monomer was evaporated at 140° C. and metered at ~2 sccm. FeCl$_3$ oxidant was controllably evaporated from a resistively heated crucible at ~230° C. The total pressure was maintained ~1 mTorr. 1 by 2 cm carbon cloth (CC) substrates were taped onto a heated stage at 80° C. The reactions were allowed 20 min. Last, samples were thoroughly rinsed by methanol and dried in a fume hood overnight.

Example 6: Fabrication of the Solid-State Flexible Supercapacitor

The solid-state supercapacitor (symmetric or asymmetric) was assembled by two pieces of EAP-integrated CC electrodes on either side of a separator (VWR® Grade 415 Filter Paper) with a H$_2$SO$_4$/PVA gel as the solid electrolyte. The H$_2$SO$_4$/PVA gel was prepared by mixing concentrated sulfuric acid, PVA, and deionized water (mass ratio=1:1:10) and heating at 90° C. under stirring for 1 h. The two electrodes and separator were soaked in the hot gel for about 5 min and then assembled together. The as-prepared device was kept in an oven at 65° C. for 24 h to remove excess water in the electrolyte, and then sealed with parafilm to prevent water absorption.

Example 7: Electrochemical Characterization and Data Processing

All electrochemical experiments were performed on a VersaSTAT4 potentiostat with a standard three-electrode or two-electrode configuration. In a three-electrode configuration, an Ag/AgCl (3 M NaCl) electrode (BASi) and a platinum wire were used as the reference electrode and the counter electrode, respectively. The electrochemical impedance spectroscopy (EIS) measurements were carried out using a 10 mV applied AC voltage from 100 kHz to 100 mHz employing an electrochemical impedance analyzer.

The specific capacitance of a single electrode ($C_{single}$) derived from cyclic voltammetry (CV) in a three-electrode configuration was calculated as [W. Chen, Z. Fan, L. Gu, X. Bao, C. Wang, *Chem. Commun.* 2010, 46, 3905]:

$$C_{single} = \frac{\int_{V_1}^{V_2}(i_a(V) - i_c(V))dV}{2(V_2 - V_1)m_{single}v}$$

where $V_1$ and $V_2$ are the cutoff potentials in cyclic voltammetry, $i_a(V)$ and $i_c(V)$ are the instantaneous anodic and cathodic currents as functions of potential, v is the scan rate, and $m_{single}$ is the mass of the EAPs for untreated samples and EAPs+PHEMAx for samples treated by iCVD in the working electrode. The specific capacitance of a single electrode derived from galvanostatic (GV) measurements in a three-electrode configuration was calculated as [Z. Lei, et al., *Energy Environ. Sci.* 2012, 5, 6391]:

$$C_{single} = \frac{I\Delta t}{m_{single}\Delta V}$$

where I is the discharge current, $\Delta t$ is the discharge time, $\Delta V$ is the voltage change, and $m_{single}$ is the mass of the active material (i.e. electroactive polymer) on the working electrode. The specific charge capacity (C/g) was obtained through multiplication of the specific capacitance (F/g) by the potential range.

In a two-electrode configuration, the specific capacitance of the supercapacitor cell ($C_{cell}$) derived from cyclic voltammetry was calculated as:

$$C_{cell} = \frac{\int_{V_1}^{V_2}(i_a(V) - i_c(V))dV}{2(V_2 - V_1)m_{both}v}$$

where $m_{both}$ is the total mass of the EAPs or EAP+PHEMAx on both electrodes. The specific capacitance of the supercapacitor cell derived from GV measurements was calculated as:

$$C_{cell} = \frac{I\Delta t}{m_{both}\Delta V}$$

The energy density (E) of the supercapacitor cell derived from GV cycling was calculated from:

$$E = \frac{I}{m_{both}}\int V(t)dt$$

where V(t) is the instantaneous voltage during the discharge process. The power density (P) was calculated from:

$$P = \frac{E}{\Delta t}$$

Example 8: Redox Thin Film (RTF) Simulation

To elucidate the effects of the hydrogel coating on the charge transport process of the underlying redox polymer film, we performed redox thin film (RTF) simulations to study the relationship between the effective charge transport diffusion coefficient ($D_{ct}$) and the separation in potential between the anodic and cathodic peak ($\Delta E_p$) that is directly observable from cyclic voltammetric experiments. The RTF model considers two fundamental processes that occur in an electro-active polymer film composed of discrete redox moieties: i) heterogeneous electron transfer at the interface between the polymer and the electrode, and ii) a diffusional charge transport process through the bulk polymer film [G. Inzelt, in *Conduct. Polym. A New Era Electrochem.*, Springer Berlin Heidelberg, Berlin, Heidelberg, 2012, pp. 83-147]. The presence of a conformal hydrogel coating on the PVF film presumably will slow down the diffusional charge transport in the bulk polymer film. In order for the ferrocene moieties to become oxidized, they need to be coupled with the anion (i.e., perchlorate in our experiments) from the bulk electrolyte solution. Therefore, if the hydrogel coating acted as a barrier for the perchlorate diffusion, the charge transport dynamics in the polymer film would be hampered. This phenomenon should translate into a larger charge transfer resistance, manifested by a larger $\Delta E_p$. The detailed procedure for the RTF simulations is documented in our previous work [X. Mao, et al., *J. Am. Chem. Soc.* 2015, 137, 1348]. Briefly, the RTF model uses the Butler-Volmer kinetic formulism to describe the heterogeneous electron transfer process at the electrode/polymer interface (a transfer coefficient of 0.5 is assumed in our calculations and a standard electron transfer rate constant of $k^0=1.2\times10^4$ $s^{-1}$ for ferrocene was used) [J. F. Smalley, et al., *J. Am. Chem. Soc.* 2003, 125, 2004], and use the diffusional kinetics (i.e., Fick's law) to depict the charge transport in the bulk polymer film (a $D_{ct}$ value of $1.1\times10^{-9}$ $cm^2/s$ was used for PVF without PHEMAx based on literature results on PVF films with perchlorate as the counterion) [T. B. Hunter, et al., *J. Electrochem. Soc.* 1987, 134, 2198]. The redox film is divided into $L_{max}$ layers with an interlayer distance of $d_{IL}$; each layer contains an identical number of redox moieties. We used a $d_{IL}$ value of 2 nm for the calculations of PVF films; note that the choice of this value only marginally affected the relation between $D_{ct}$ and the $\Delta E_p$. The value of $L_{max}$ was obtained by fitting the model to the experimentally determined $D_{ct}$-$\Delta E_p$ relation. Note that the $L_{max}$ values are assumed to be the same for PVF/CP and PVF-h/CP with different iCVD treatment times since the PVF coating around the carbon fibers was prepared using the same potentiostatic deposition time (10 min) under identical experimental conditions.

Example 9: Electrochemical Cycle Stability Analysis

Figure 4:
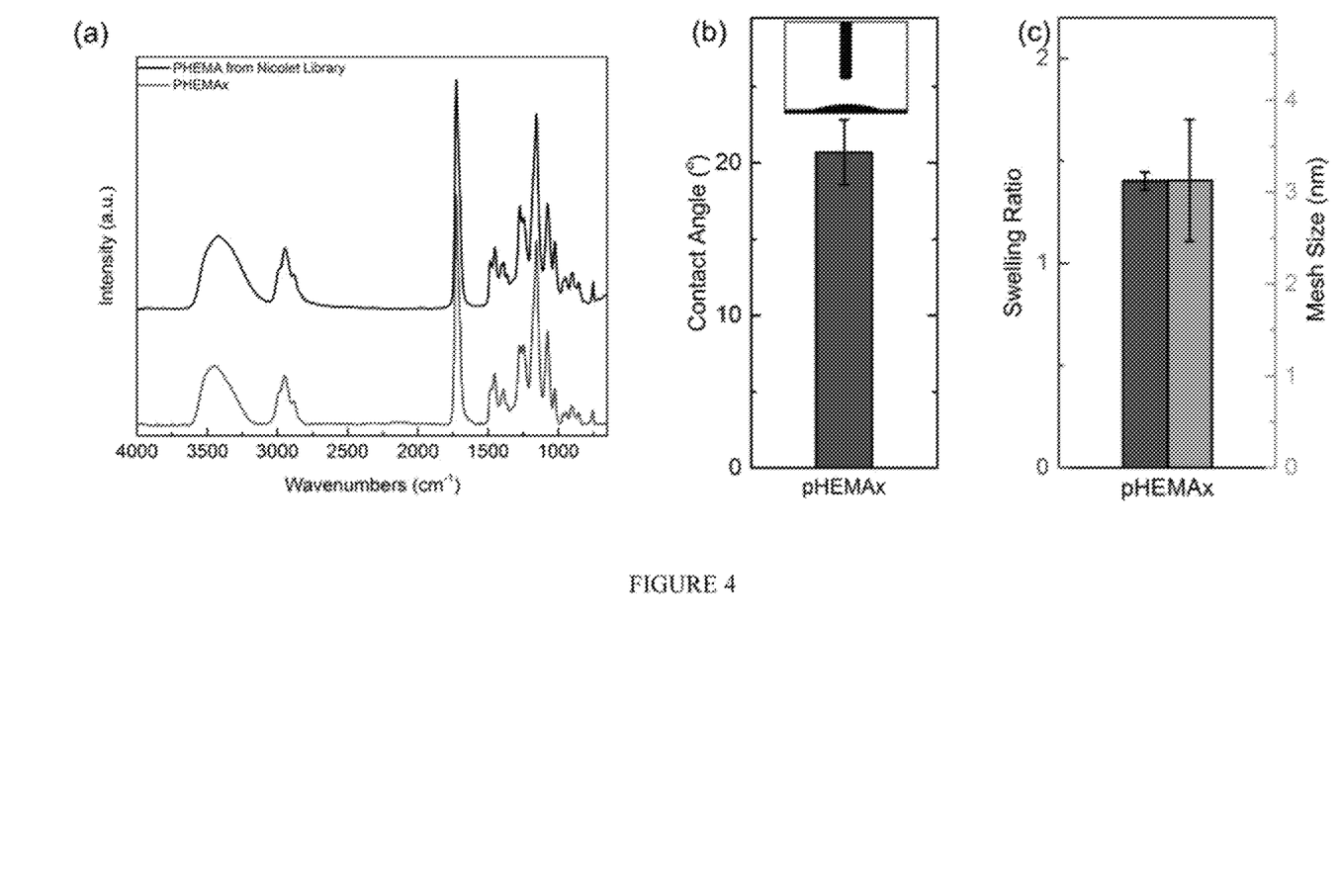
FIG. 4 consists of panels (a)-(c), and depict various intrinsic properties of PHEMAx. Panel (a) shows FTIR spectra of iCVD PHEMAx and PHEMA (without the cross-linker) from the Nicolet™ Sample Library. The overlapping of peaks suggests the retention of HEMA functional groups during iCVD synthesis. Panel (b) shows the water contact angle of PHEMAx on a silicon wafer substrate. Panel (c) shows the swelling ratio of PHEMAx and the calculated average mesh size (nm) of the swollen hydrogel.
Figure 8:
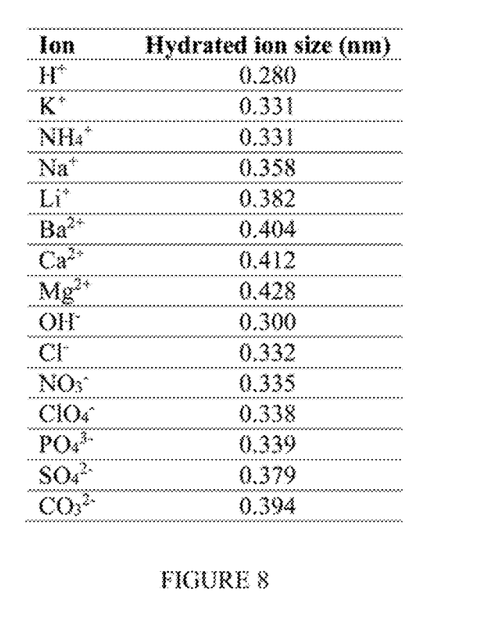
FIG. 8 is a table depicting sizes of common hydrating ions.

The prototype polymer network developed in our study to coat and stabilize EAPs is poly(2-hydroxyethyl methacrylate) (PHEMA) cross-linked by di(ethylene glycol) divinyl ether (DEGDVE). The chemical cross-linking was deliberately introduced to enhance the structural stability of the resulting iCVD hydrogel.[31] Hereafter the crosslinked PHEMA is denoted PHEMAx. As the first proof of concept, we studied the effects of the hydrogel coating on the electrochemical cyclic stability of a model EAP, polyvinylferrocene (PVF), which has various important electrochemical applications such as energy storage,[32] biosensing,[33, 34] and redox-tunable catalysis[35] and separation.[11, 12] Prior to the iCVD treatment, PVF was deposited potentiostatically on a conductive carbon paper (CP) substrate to generate a PVF/CP hybrid (Example 1), which was subsequently transferred into an iCVD chamber for conformal coating of PHEMAx throughout the porous PVF/CP electrodes (Example 2). Hereafter the nomenclature "A/B" or "A-h/B" is used to identify a multi-component construct, where "A" indicates the active material system (e.g., an EAP), "A-h" indicates A is modified with a PHEMAx coating that turns into a hydrogel upon contacting water, and "B" is the conductive substrate on which A is deposited. The resulting PVF-h/CP system consisted of ternary core-shell fibers with individual components from the innermost being carbon fiber, PVF and PHEMAx. PHEMAx was selected as the polymer matrix for the soft confinement layer because of its ability to form a hydrogel upon swelling in aqueous electrolytes, allowing the transport of ions.[31, 36] Owing to iCVD's precise control over thickness, the ultrathin hydrogel outermost layer would not add a substantial resistance to the ion transport. More importantly, iCVD PHEMAx-based hydrogels generally exhibit moderate swelling ratios (<1.55),[31] which is crucial for our soft confinement concept; high water content would compromise the gel's mechanical strength whereas low water content would result in small mesh sizes and therefore high resistance to ion transport. The PHEMAx coating synthesized under our conditions had a swelling ratio of 1.40±0.04, corresponding to a mesh size of 3.12±0.66 nm based on the Flory-Huggins theory assuming uniaxial swelling of an elastic network (Example 3).[36] Such a mesh size would allow easy transport of most aqueous electrolyte ions for energy storage applications (FIG. 8); perchlorate and sulfate ions used in our study have hydrated ion sizes of 0.34 and 0.38 nm, respectively.[37] The Fourier transform infrared spectrum (FTIR) of PHEMAx confirms the retention of HEMA functional groups via iCVD synthesis (FIG. 4, panel a). The water contact angle of a PHEMAx film on a smooth silicon wafer was measured to be 20.70±0.12° (FIG. 4, panel b), demonstrating the hydrophilicity of PHEMAx.

Scanning electron microscopic (SEM) imaging of CP, PVF/CP, and PVF-h/CP (FIG. 1, panels b, c and d, respectively) shows clear morphological differences across the three systems. Compared to bare CP, PVF/CP exhibits a larger fiber diameter and a rougher surface, indicating the presence of the PVF polymer. After being coated with PHEMAx, the fiber displays a further increase in diameter and a smoother surface, revealing a conformal PHEMAx layer wrapping around the PVF/CP fibers. X-ray photoelectron spectroscopic (XPS) survey scans of CP, PVF/CP, and PVF-h/CP are displayed in FIG. 1, panel e. PVF/CP shows pronounced $Fe_{2p1/2}$ and $Fe_{2p3/2}$ peaks at 715 and 705 eV, respectively, characteristic of ferrocene, while these peaks are completely absent for PVF-h/CP. This suggests that, after the iCVD treatment, the surface of the PVF/CP network was fully covered by PHEMAx. Notably PVF-h/CP has an O/C ratio of 0.52±0.06, consistent with the theoretical value (0.5) for HEMA, corroborating that the outermost shell in PVF-h/CP consists mainly of PHEMA.

Example 10: Electrochemical Measurements of Hydrogel-Coated EAP

Figure 1:
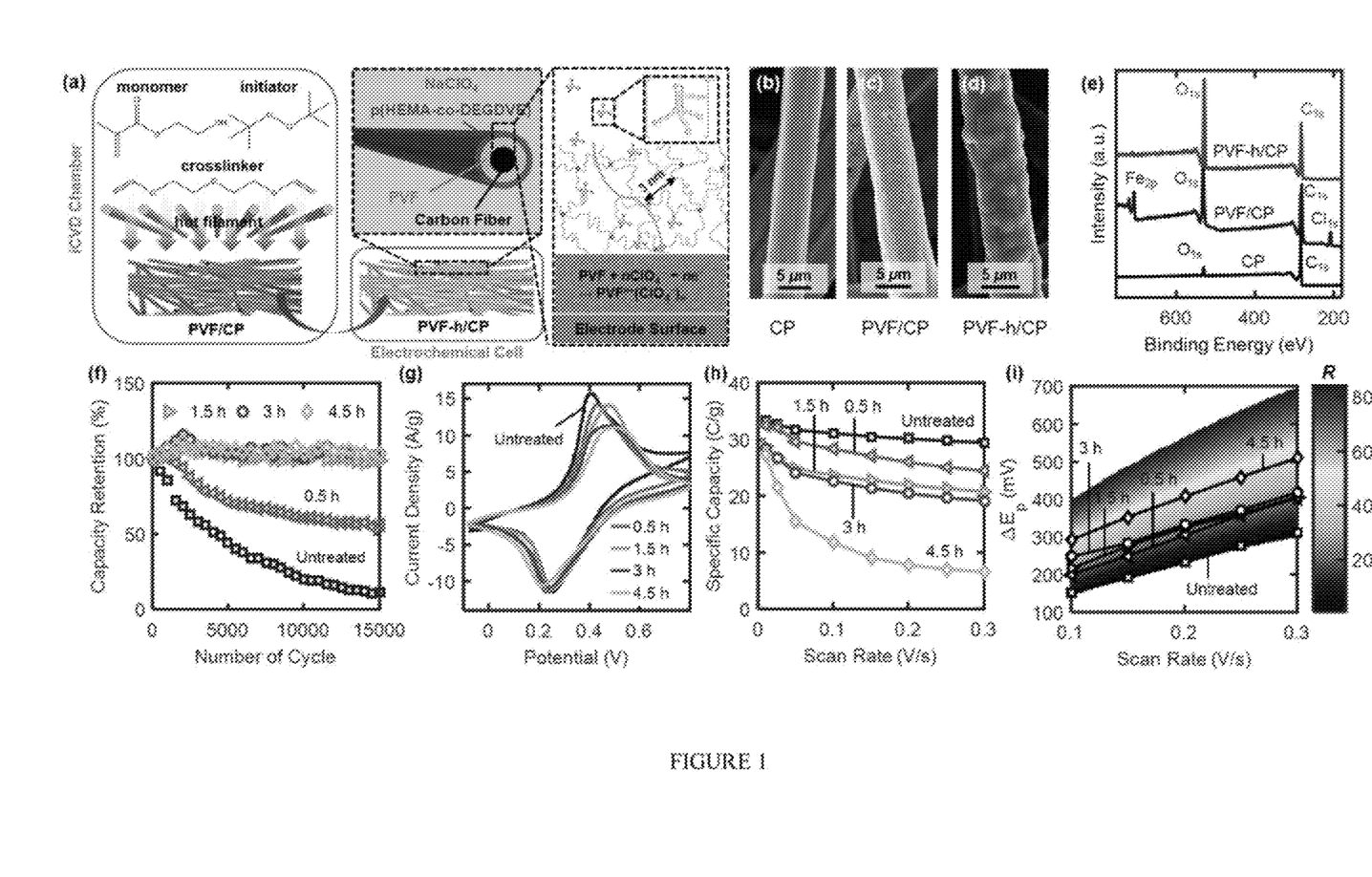

Next, we performed electrochemical tests on PVF-h/CP. For details on all electrochemical measurements, see Example 7. Throughout this report the current density (A/g) and specific capacity (C/g) of each electrode system are reported with respect to the total mass of the polymer components, including both the EAP and the PHEMAx coating (if any), unless otherwise noted. Electrochemical cycling stability of PVF-h/CP was first examined using cyclic voltammetry (CV). As shown in FIG. 1, panel f, PVF/CP, without iCVD treatment, exhibits a significantly reduced specific capacity after 15000 cycles (only ~12% retention), while PVF-h/CP with 1.5 to 4.5 h iCVD treatments shows virtually 100% capacity retention. With only 0.5 h iCVD treatment, improved stability relative to unmodified PVF/CP was still observed (~54% retention after 15000 cycles). It is imperative that the improved cycling stability not be at the expense of the specific capacities. From CVs obtained at the fifth cycle (i.e., before significant degradation occurred) (FIG. 1, panel g), we observed comparable current densities before and after the iCVD treatment, indicating that inclusion of the hydrogel layer did not reduce the specific capacities significantly. The difference in potential between the anodic and cathodic peaks in CVs ($\Delta E_p$) appeared to increase with the iCVD treatment, suggestive of increased ion diffusion resistance, which may affect rate capabilities. To evaluate the rate performance, we plot the specific capacity versus scan rates (FIG. 1, panel h), from which it can be seen that with a prolonged iCVD treatment (4.5 h) a markedly jeopardized rate performance resulted. Therefore, 3 h appears to be an optimal iCVD treatment time that yields the best combination of capacity retention and rate performance preservation. We observed slightly reduced specific capacities for the coated samples at low scan rates, because of the added weight of electrochemically inert PHEMAx component. If we normalize to the mass of PVF only, we actually obtain slightly increased specific capacities; for instance, the specific capacities obtained at 0.01 V/s for PVF/CP and PVF-h/CP with a 3 h iCVD treatment are 33.4 and 35.7 C/g, respectively. The surface covered by PHEMAx had a higher degree of hydrophilicity (water contact angle=20.7°) than that covered by ferrocene (water contact angle=71°);[34] a hydrogel coating on PVF could facilitate its interaction with perchlorate.

Further, we elucidated quantitatively the effects of the hydrogel coating on the electrochemical charge transport dynamics in PVF. Mechanistically, charge propagation in an EAP system with discrete redox sites (e.g., PVF) is a diffusive process that relies on sequential electron exchange between adjacent redox groups and restricted local motions of polymer chains.[19,38,39] This diffusive process is usually described by an effective charge transport diffusion coefficient ($D_{ct}$). The presence of the hydrogel coating would hinder the diffusion of counterion (i.e., perchlorate) from the bulk solution, and, consequently, would affect the charge transport kinetics of the PVF film, leading to lowered $D_{ct}$ values. Notably the rate of ion intercalation into the polymer film and subsequent binding with ferrocene governs the redox transformation kinetics of PVF. Experimentally, the hindered charge transport dynamics in PVF was manifested by the increased $\Delta E_p$ values (FIG. 1, panel g). To quantify the effects of iCVD conditions on the charge transport dynamics (i.e., $D_{ct}$ values), we used a redox thin film (RTF) model[35, 40-42] (Example 8) to simulate the instantaneous current responses of PVF during linear potential sweeping at varying scan rates ($v_s$) using a series of different $D_{ct}$ values. FIG. 1, panel i shows a heat map of simulated $\Delta E_p$-$v_s$ data with varying R, which is defined as the ratio of the $D_{ct}$ value for pure PVF to the reduced $D_{ct}$ value for PVF with a hydrogel coating (i.e., $R = D_{ct}^{PVF}/D_{ct}^{PVF-h}$). By overlaying the experimentally obtained $\Delta E_p$-$v_s$ data with the simulated heat map, we observed that, compared to untreated PVF, short iCVD treatments (0.5 to 3 h) decreased $D_{ct}$ by ~20 fold (i.e., R≈20) while a longer treatment (4.5 h) reduced $D_{ct}$ by ~50 fold.

Figure 5:
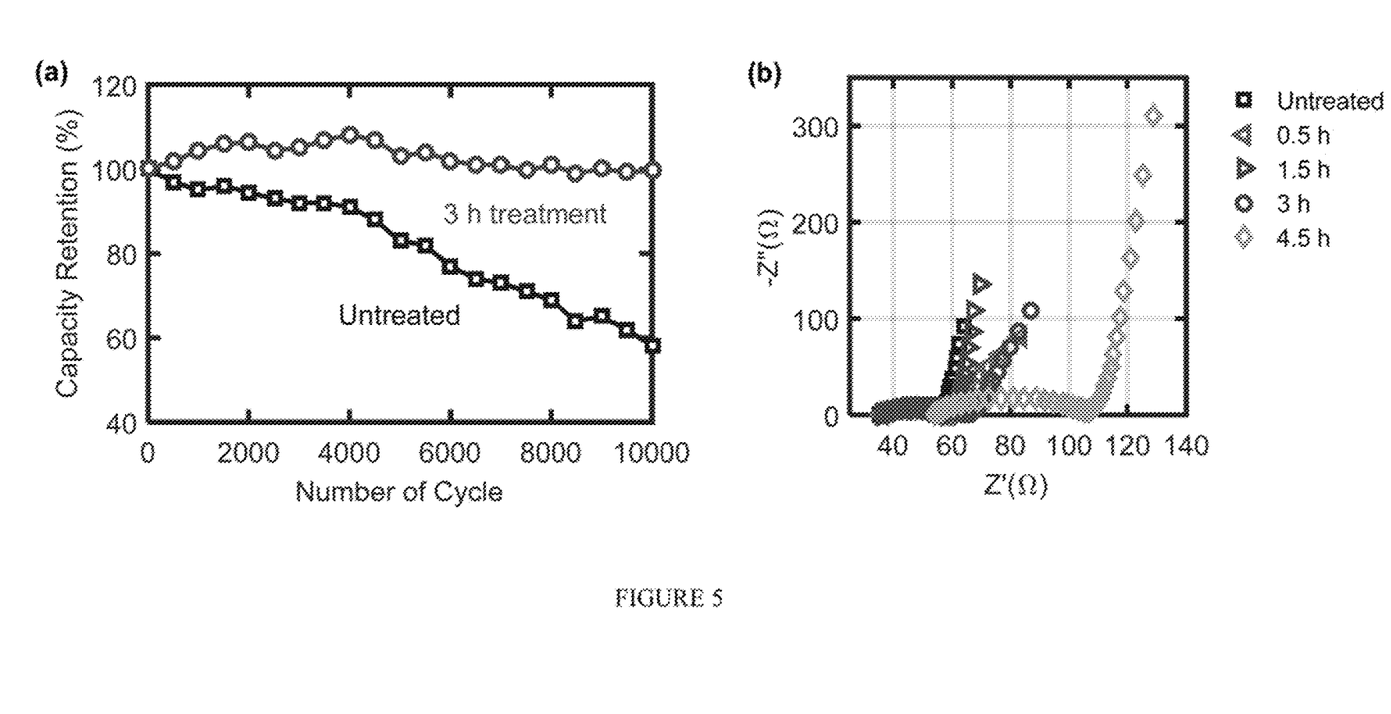
FIG. 5 consists of panels (a) and (b). Panel (a) is a graph showing capacity retention versus number of GV cycles for untreated PVF/CP and PVF-h/CP with 3 h iCVD treatment. GV cycling experiments were performed at 1.34 A/g for untreated PVF/CP and at 1.23 A/g for PVF-h/CP sin 0.5 M $NaClO_4$ using a three-electrode configuration. Panel (b) is a Nyquist plot for PVF/CP (untreated) and PVF-h/CP with 0.5, 1.5, 3 and 4.5 h iCVD treatment. The EIS measurements were obtained using a 10 mV applied AC voltage from 100 kHz to 100 mHz in an aqueous solution of 0.5 M $NaClO_4$ with a three-electrode configuration.

Galvanostatic (GV) cycling (FIG. 5, panel a) yielded consistent conclusions with the CV measurements (FIG. 1, panel f): the capacity retention after 10000 GV cycles at 1.34 A/g was 58% for PVF/CP without PHEMAx, whereas the capacity retention after 10000 GV cycles at 1.23 A/g was nearly 100% for PVF-h/CP with a 3 h iCVD treatment. Electrochemical impedance spectroscopic (EIS) measurements (FIG. 5, panel b) show that the combined series resistances ($R_s$) for PVF-h/CP with 0.5, 1.5 and 3 h treatments were 35.9, 36.2, and 37.4Ω, respectively, close to the value for untreated PVF (35.7Ω), whereas the 4.5 h treatment resulted in a larger $R_s$ value (54.1Ω).

Example 11: Application of Soft Confinement Strategy to ICPs

Figure 2:
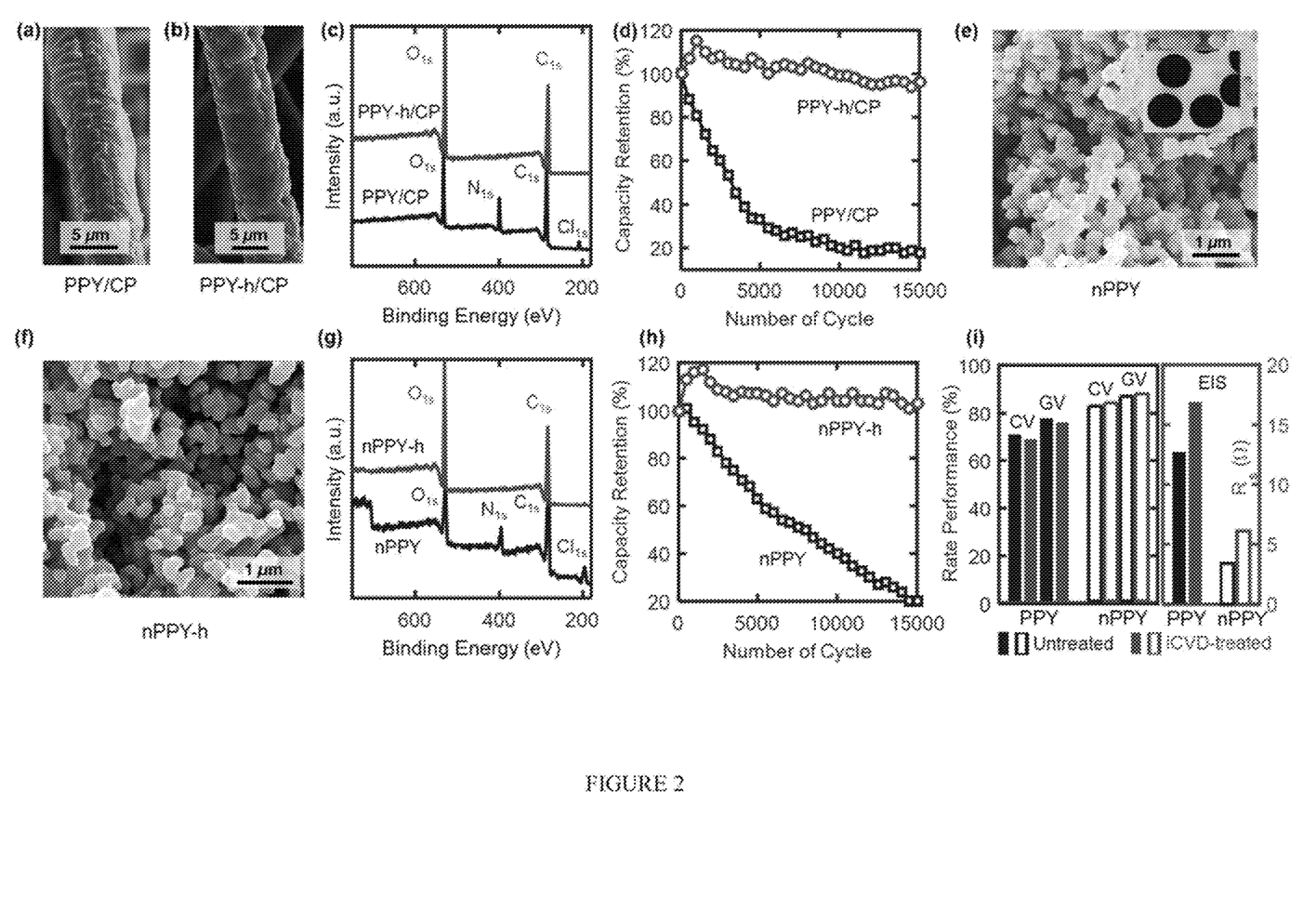
Figure 6:
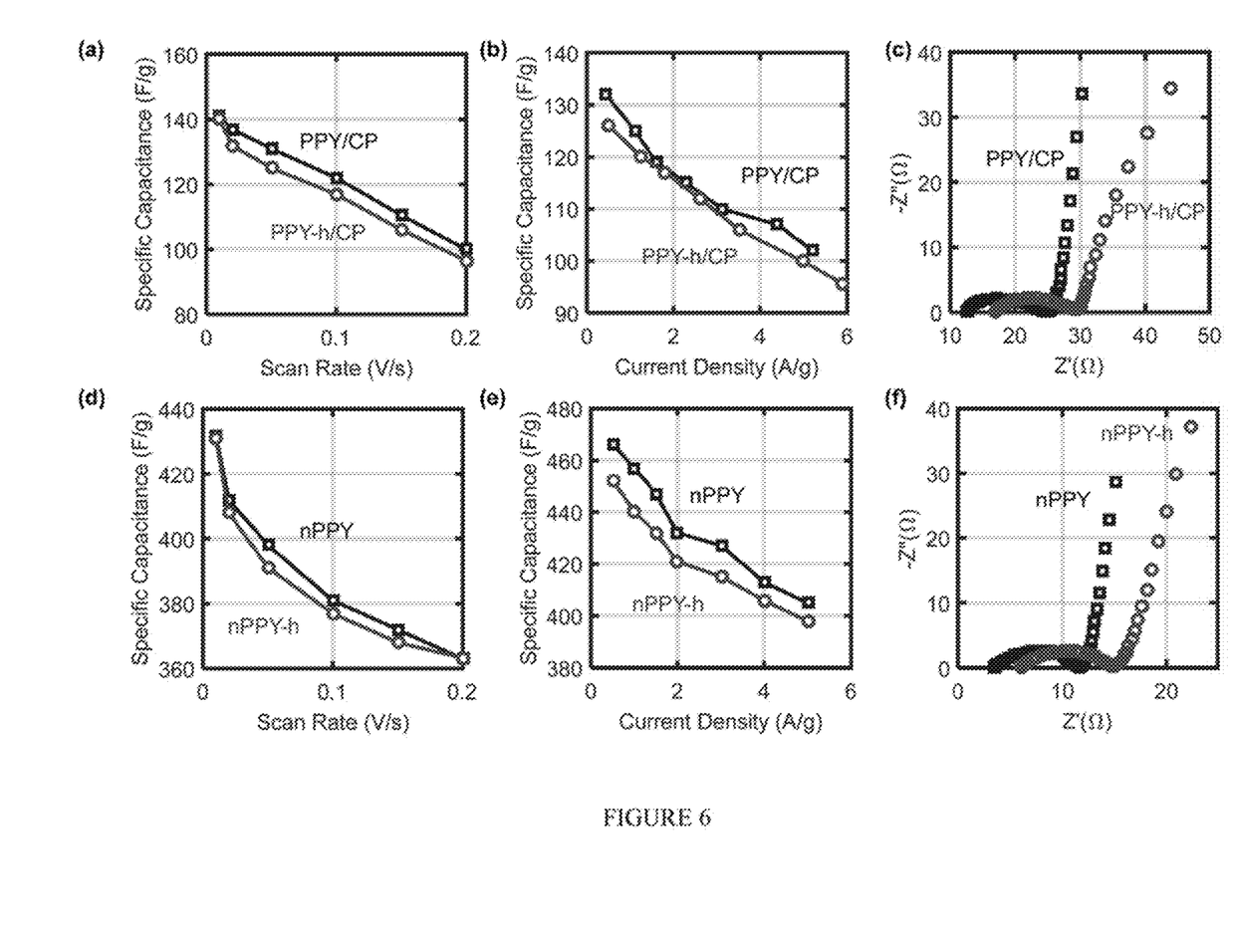
FIG. 6 consists of panels (a)-(f). Panel (a) plots specific capacitance versus scan rate for PPY/CP and PPY-h/CP obtained by CV measurements. Panel (b) plots specific capacitance versus current density for PPY/CP and PPY-h/CP obtained by GV measurements. Panel (c) is a Nyquist plot for PPY/CP and PPY-h/CP obtained by EIS measurements. Panel (d) plots specific capacitance versus scan rate for nPPY and nPPY-h obtained by CV measurements. Panel (e) plots specific capacitance versus current density for nPPY and nPPY-h obtained by GV measurements. Panel (f) is a Nyquist plot for nPPY and nPPY-h obtained by EIS measurements. The coatings for PPY-h/CP and nPPY-h discussed in Figure S4 were synthesized by a 3 h iCVD treatment. The CV, GV and EIS (10 mV amplitude, from 100 kHz to 10 mHz) experiments were performed in an aqueous solution of 0.5 M $NaClO_4$ employing a three-electrode configuration.

Next, we investigate the applicability of our soft confinement approach for stabilizing EAPs beyond PVF. EAPs are categorized into two general classes: redox polymers with unconjugated backbones and intrinsically conducting polymers (ICPs) with conjugated backbones.[19,39] The PVF films studied earlier belong to the first category. ICPs are also widely used in electrochemical applications and their performance stability is an even more severe issue than that of redox polymers because the rigid conjugated backbones make ICPs more prone to electrochemical degradation during cyclic operation.[19] Hence, it was of interest to study whether our stabilization approach would be effective for ICPs. We used polypyrrole (PPY) as the model ICP system, which has been employed widely as the active component in energy storage devices.[18] We first studied the impact of incorporation of PHEMAx on the cycling stability of PPY electrochemically deposited on CP (Example 1). SEM images of PPY/CP and PPY-h/CP (3 h iCVD treatment) (FIG. 2, panels a, b) show clear morphological differences, indicating conformal coating of PHEMAx on top of PPY. XPS survey scans (FIG. 2, panel c) demonstrate that after the iCVD treatment, the $N_{1s}$ peak disappears, confirming a complete coverage of the PPY layer by PHEMAx around the PPY-h/CP fibers. CV tests at 0.1 V/s reveal that PPY-h/CP had significantly improved cycling stability, with 98% capacity retention compared to only 17% retention for PPY/CP (FIG. 2, panel d). Notably, the PPY films deposited on CP exhibited a nonporous structure (see FIG. 2, panel a). Nanostructured ICPs possessing increased surface area and shortened ion diffusion pathways usually exhibit higher capacitances than do their nonporous counterparts; however, nanosized ICPs usually have more brittle structures, and therefore further deteriorated cycling stability.[14, 20] To investigate whether the PHEMAx coating can also improve cycling stability of nanostructured ICPs, we prepared free-standing nanostructured PPY gels (nPPY; FIG. 2, panel e inset shows photographs of free-standing pellet-like nPPY gels). For synthesis of nPPY, see Example 4. SEM imaging shows that the as-prepared nPPY exhibits a porous structure comprised of spherical particles (FIG. 2, panel e). After the iCVD treatment, the particles present a more rounded morphology, indicating the existence of a PHEMAx coating (FIG. 2, panel f). The coating displays a high degree of conformality, showing practically no blockage of the pores, which is crucial for preserving the desired advantages of the porous nanostructures. The absence of a $N_{1s}$ peak and the O/C ratio being consistent with that of HEMA in the XPS spectrum of nPPY-h (FIG. 2, panel g) confirms that the interfaces in nPPY-h are completely covered by PHEMAx. Compared to nPPY, nPPY-h displays substantially improved cycling stability (FIG. 2, panel h). Importantly, for both the PPY and nPPY cases, we did not observe significantly compromised transport rates or increased resistances due to the iCVD treatment, as shown in FIG. 2, panel i, which summarizes the capacitance decay with increased operation rate (scan rate for CV or current density for GV), and the $R_s$ values obtained from EIS. Plots of capacitance versus scan rate or current density, and EIS spectra are shown in FIG. 6.

Example 12: Mechanical Stability of EAPs

Recently, a demand for improving the mechanical stability of EAP systems under strained conditions has emerged for the development of flexible, bendable electronics.[8, 16]

Figure 3:
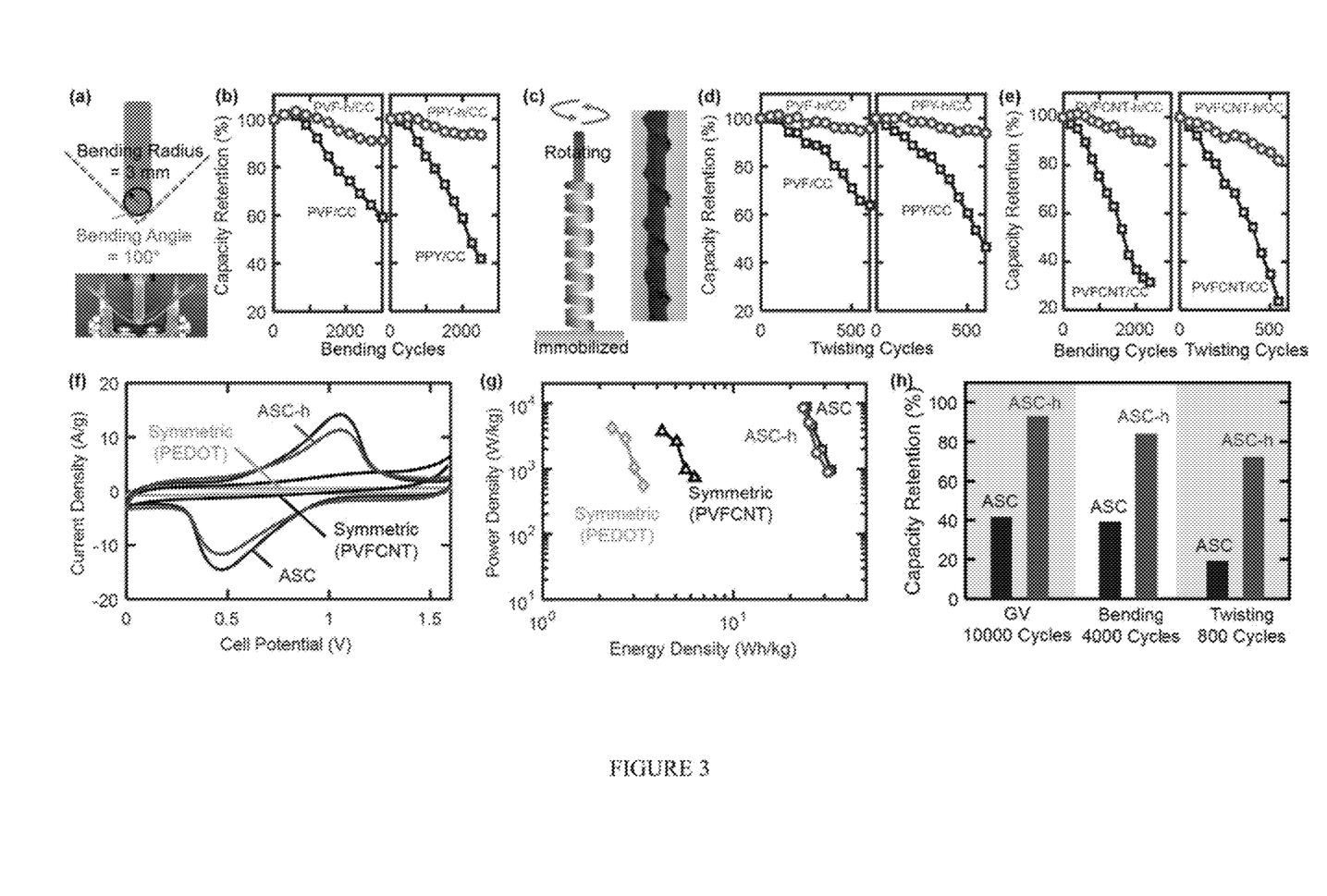

To show that the soft confinement approach is applicable for improving the mechanical stability of EAPs under strained conditions, we conducted bending and twisting tests for PHEMAx-coated PVF and PPY (representing redox polymers and ICPs, respectively) integrated into a flexible carbon cloth (CC) substrate. A bending cycle is defined as compressively flexing the electrode using a mechanical tester from angle of 180° to 100° (radius=3 mm) and then returning it to the original position (FIG. 3, panel a). FIG. 3, panel b shows the capacitance retention versus number of bending cycles for PVF/CC, PVF-h/CC, PPY/CC and PPY-h/CC. Without the hydrogel coating, PVF/CC showed only 59.3% capacity retention after 3000 bending cycles, possibly due to the expected stress-induced detachment of polymer films from CC yarns under strained conditions. In contrast, PVF-h/CC showed remarkably improved capacity retention (90.8%) after the same number of bending cycles, demonstrating that the robust soft confinement reduces the degree of EAP detachment. Similar results were observed for PPY-based systems: after 2500 bending cycles, PPY/CC retained only 41.7% of its initial specific capacity whereas PPY-h/CC preserved 93.1% of its initial specific capacity. We further performed twisting tests whereby each twisting cycle is defined as the rotation of a 1 cm×16 cm electrode by 360°×8=2880° with a controlled electrical drill followed by a return to the original position (FIG. 3, panel c). The capacity retentions of PVF/CC, PVF-h/CC, PPY/CC and PPY-h/CC after 600 such twisting cycles (FIG. 3, panel d) were calculated to be 63.6%, 95.7%, 46.7% and 93.7%, respectively, demonstrating that the samples with the hydrogel coating exhibited a stronger preservation of their energy storage performance under twisting conditions. Composite materials containing EAP and "nano-fillers" such as carbon nanotubes and activated carbon usually display high energy densities and excellent rate performance.[14, 20] These materials are, however, more susceptible to mechanical stress since these "nano-fillers" fall off their substrates easily.[43] Therefore, we moved on to investigate if our EAP stabilization approach would be effective for EAP/nanofiller composites. We modified CC substrates with nanocomposites consisting of PVF and metallic carbon nanotubes (CNTs) by electrochemical deposition from stable suspensions containing PVFCNT complexes formed via the strong π-stacking interaction between the cyclopentadiene rings of PVF and the $sp^2$-carbon surfaces of CNTs (Example 1).[44] The resulting PVFCNT nanocomposites (polymer to CNT mass ratio≈4) typically exhibited pores with an average diameter of ~50-100 nm and BET surface area of 112 $m^2/g$.[44] Compared to PVF/CC and PPY/CC, PVFCNT showed poorer performance stability under strained conditions (FIG. 3, panel e): the capacity retention of PVFCNT/CC was 31.6% after 2400 bending cycles and 23.5% after 550 twisting cycles. Remarkably, the encapsulation of PVFCNT nanocomposites with a hydrogel coating led to significantly improved performance stability: the capacity retentions for PVFCNT-h/CC after the same bending and twisting tests as for PVFCNT/CC were 89.7% and 82.1%, respectively.

Example 13: Asymmetric Supercapacitor Design to Enhance Energy Densities

The enhancement of energy densities in supercapacitor devices is key to realizing their commercialization for practical applications such as hybrid electrical vehicles, self-powered portable devices, and many other heavy-duty renewable energy systems. Energy densities (E) can be enhanced by increasing the specific capacitance (C) and/or widening the operating potential window (V), according to the $E=(CV^2)/2$ [G. P. Wang, et al., Chem. Soc. Rev. 2012, 41, 797]. The use of asymmetric supercapacitors (ASCs) would allow for a significantly widened potential window if a positive electrode and a negative electrode were to be combined appropriately. [C. Zhou, et al., Nano Lett. 2013, 13, 2078, P. H. Yang, et al., Nano Lett. 2014, 14, 731]. We used the PVFCNT composite as the positive electrode because it had been found to exhibit significantly higher energy densities than PVF alone without the CNT component [X. Mao, et al., J. Mater. Chem. A 2013, 1, 13120]. However, it should be noted that, based on the measurements conducted in a three-electrode configuration, the CV profile of PVFCNT (FIG. 7, panel c) had high current densities only in the potential range from ~0 to 0.6 V versus Ag/AgCl, the range over which the redox reaction of ferrocene occurs. It can be clearly seen from FIG. 7, panel c that at the potentials lower than 0 V or higher than 0.6 V, the current densities decreased significantly. If a symmetric configuration was adopted (i.e., using PVFCNT as both the positive and negative electrodes), the negative electrode that was forced to work in the potential range lower than 0 V would only yield very low capacitances. The negative electrode with small capacitances would therefore lead to a low overall total capacitance of the device because $1/C_{overall}=1/C_{pos}+1/C_{neg}$, where $C_{overall}$ is the overall capacitance of the capacitor, and $C_{pos}$, $C_{neg}$ are the capacitances of the positive and negative electrodes, respectively.

Figure 7:
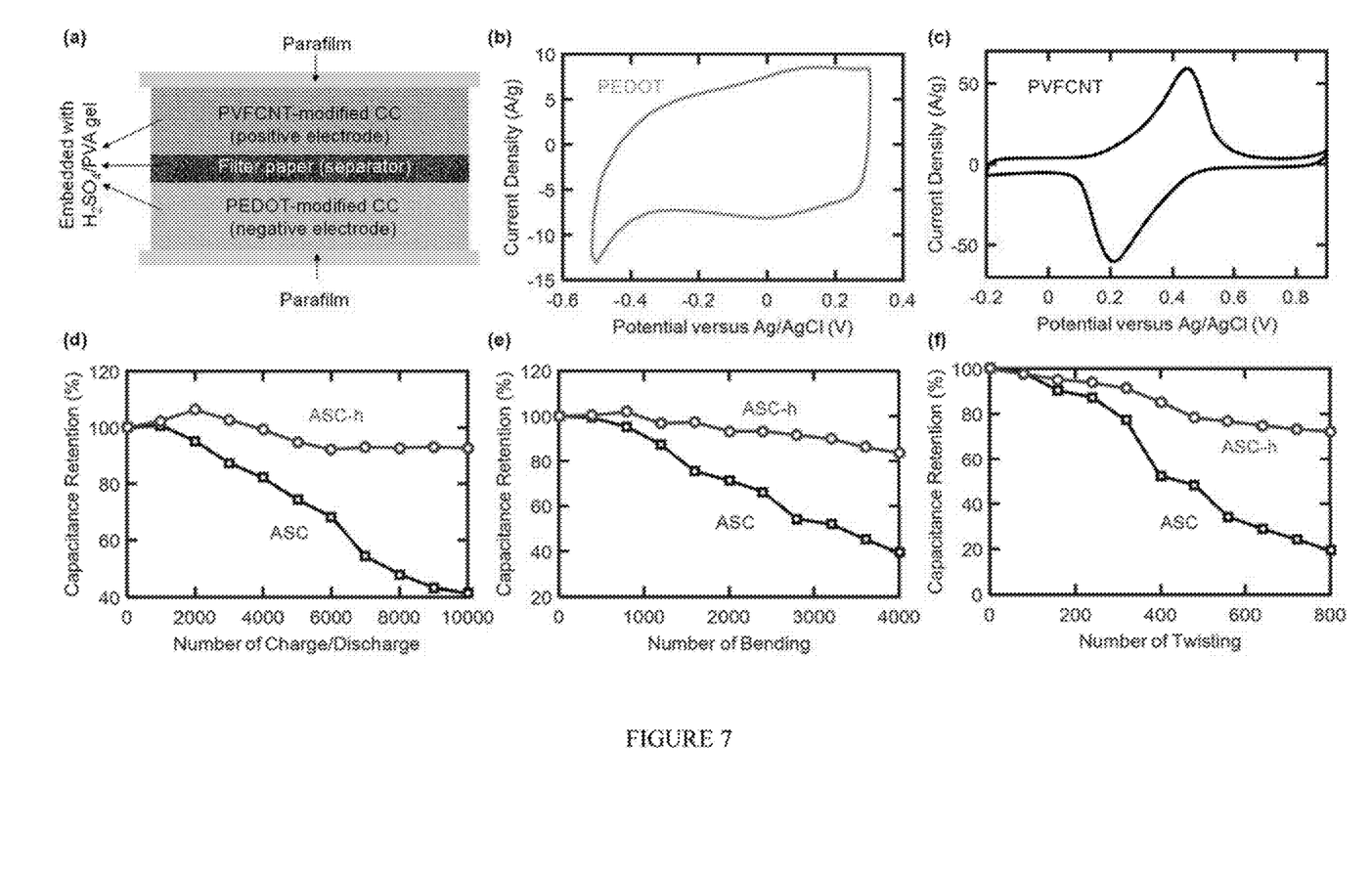
FIG. 7 consists of panels (a)-(f). Panel (a) is a schematic illustration of the flexible solid-state asymmetric supercapacitor that consists of a PVFCNT-h positive electrode and a PEDOT-h negative electrode. Panel (b) depicts a CV curve of a PEDOT electrode obtained in 1 M $H_2SO_4$ at a scan rate of 0.05 V/s with a three-electrode configuration. Panel (c) depicts a CV curve of a PVFCNT electrode obtained in 1 M $H_2SO_4$ at a scan rate of 0.05 V/s with a three-electrode configuration. Panel (d) plots capacitance retention versus of number of GV cycles for the solid state ASC devices. GV cycling was performed at 1.2 A/g for ASC and 1.4 A/g for ASC-h. Panel (e) plots capacitance retention versus number of bending cycles for ASC and ASC-h. The specific capacitances were measured by CV at 0.1 V/s. Panel (f) plots capacitance retention versus number of twisting cycles for ASC and ASC-h. The specific capacitances were obtained by CV measurements at 0.1 V/s.

Usually carbon-based electrodes exhibiting good stability at negative potentials are used as negative electrodes to balance the charge from EAP-based positive electrodes. However, carbon electrodes only give double-layer capacitances rather than pseudocapacitances; hence, these carbon-based negative electrodes usually display relatively small capacitances and require large mass loadings to meet the charge balance requirement, thereby decreasing the overall specific capacitances of ASC devices. Recall that the PVFCNT positive electrode displayed large current densities from 0 to 0.5 V. Therefore, we need to identify a negative electrode that offers sufficiently large current densities in the opposite potential window (around −0.5 to 0 V). Common carbon-based negative electrodes would yield low overall capacitances, as discussed earlier. We chose a psuedocapacitive conducting polymer PEDOT as the negative electrode because it showed high current densities from around −0.5 to 0 V versus Ag/AgCl (FIG. 7, panel b). The charge balance between the positive and negative electrodes was achieved by using $m_{pos}cap_{pos}=m_{neg}cap_{neg}$, where $m_{pos}$, $m_{neg}$ are the mass of the active material on the positive and negative electrodes, respectively, and $cap_{pos}$, $cap_{neg}$ are the specific capacitances of the positive and negative electrodes at the respective operation potential ranges, respectively (i.e., 0 to 0.5 V versus Ag/AgCl for PVFCNT, and −0.5 to 0 V versus Ag/AgCl for PEDOT).

Example 14: Application to Energy Storage Devices

To demonstrate the effectiveness of the soft confinement strategy in practical energy storage devices, we constructed a flexible solid-state asymmetrical supercapacitor (ASC) and studied the influence of the PHEMAx coating on its performance stability. ASC modified with PHEMAx is denoted as ASC-h. The ASC (FIG. 7, panel a, Example 6) consisted of PVFCNT as the positive electrode and poly(3,4-ethylenedioxythiophene) (PEDOT) synthesized by oxidative chemical vapor deposition (oCVD) as the negative electrode. The asymmetrical configuration was adopted to enhance the energy densities by providing matching operating potential ranges between the positive and negative electrodes (Example 13). As controls, we prepared symmetric PVFCNT and PEDOT supercapacitors. CV profiles (FIG. 3, panel f) show that the asymmetrical devices yielded significantly higher current densities than those obtained with the symmetric devices. Notably, the asymmetric devices exhibited the desired redox peaks of ferrocene whereas the symmetric devices failed to produce such redox peaks. For comparison, CVs of PEDOT and PVF-CNT in a three-electrode configuration are shown in FIG. 7, panels b and c, respectively. The Ragone plot (FIG. 3, panel g) shows that ASC and ASC-h achieved maximum energy densities of 32.4 and 31.2 Wh/kg, respectively, significantly larger than the values for symmetrical devices with either PEDOT (3.37 Wh/kg) or PVFCNT (6.26 Wh/kg). The capacitance retentions of ASC and ASC-h after 10000 GV charging/discharging cycles, 4000 bending cycles, and 800 twisting cycles (rotation span=360°×½=180°) are summarized in FIG. 3, panel h, based on which it is evident that incorporation of PHEMAx improved the performance stability significantly. The capacitance retentions versus the number of GV cycles, bending cycles, and twisting cycles are shown in FIG. 7, panels d, e and f, respectively.

CITED REFERENCES

[1] J. Kim, J. Lee, J. You, M. S. Park, M. S. Al Hossain, Y. Yamauchi, J. H. Kim, *Mater. Horizons* 2016, 3, 517.
[2] S. Holliday, R. S. Ashraf, A. Wadsworth, D. Baran, S. A. Yousaf, C. B. Nielsen, C.-H. Tan, S. D. Dimitrov, Z. Shang, N. Gasparini, M. Alamoudi, F. Laquai, C. J. Brabec, A. Salleo, J. R. Durrant, I. McCulloch, *Nat. Commun.* 2016, 7, 11585.
[3] B. Russ, A. Glaudell, J. J. Urban, M. L. Chabinyc, R. A. Segalman, *Nat. Rev. Mater.* 2016, 1, 16050.
[4] A. Liu, P. Kovacik, N. Peard, W. Tian, H. Goktas, J. Lau, B. Dunn, K. K. Gleason, *Adv. Mater.* 2017, 29, 1606091.
[5] D. Svirskis, J. Travas-Sejdic, A. Rodgers, S. Garg, *J. Control. Release* 2010, 146, 6.
[6] R. Feiner, L. Engel, S. Fleischer, M. Malki, I. Gal, A. Shapira, Y. Shacham-Diamand, T. Dvir, *Nat. Mater.* 2016, 15, 679.
[7] J. Y. Oh, S. Rondeau-Gagne, Y. C. Chiu, A. Chortos, F. Lissel, G. J. N. Wang, B. C. Schroeder, T. Kurosawa, J. Lopez, T. Katsumata, J. Xu, C. X. Zhu, X. D. Gu, W. G. Bae, Y. Kim, L. H. Jin, J. W. Chung, J. B. H. Tok, Z. N. Bao, *Nature* 2016, 539, 411.
[8] T. Someya, Z. N. Bao, G. G. Malliaras, *Nature* 2016, 540, 379.
[9] R. Green, M. R. Abidian, *Adv. Mater.* 2015, 27, 7620.
[10] W. B. Guo, X. D. Zhang, Y. Yu, S. Wang, J. C. Qiu, W. Tang, L. L. Li, H. Liu, Z. L. Wang, *ACS Nano* 2016, 10, 5086.
[11] X. Su, K.-J. Tan, J. Elbert, C. Ruttiger, M. Gallei, T. F. Jamison, T. A. Hatton, *Energy Environ. Sci.* 2017, 10, 1272.
[12] X. Su, H. J. Kulik, T. F. Jamison, T. A. Hatton, *Adv. Funct. Mater.* 2016, 26, 3394.
[13] D. S. Achilleos, T. A. Hatton, *ACS Appl. Mater. Interfaces* 2016, 8, 32743.
[14] Y. Shi, L. L. Peng, Y. Ding, Y. Zhao, G. H. Yu, *Chem. Soc. Rev.* 2015, 44, 6684.
[15] C. O. Baker, X. Huang, W. Nelson, R. B. Kaner, *Chem. Soc. Rev.* 2017, 46, 1510.
[16] B. C. Kim, J.-Y. Hong, G. G. Wallace, H. S. Park, *Adv. Energy Mater.* 2015, 5, 1500959.
[17] T. Y. Liu, L. Finn, M. H. Yu, H. Y. Wang, T. Zhai, X. H. Lu, Y. X. Tong, Y. Li, *Nano Lett.* 2014, 14, 2522.
[18] Y. Song, T. Y. Liu, X. X. Xu, D. Y. Feng, Y. Li, X. X. Liu, *Adv. Funct. Mater.* 2015, 25, 4626.
[19] G. Inzelt, in *Conduct. Polym. A New Era Electrochem.*, Springer Berlin Heidelberg, Berlin, Heidelberg, 2012, pp. 83-147.
[20] S. Ghosh, T. Maiyalagan, R. N. Basu, *Nanoscale* 2016, 8, 6921.
[21] X. H. Xia, D. L. Chao, Z. X. Fan, C. Guan, X. H. Cao, H. Zhang, H. J. Fan, *Nano Lett.* 2014, 14, 1651.
[22] W. Q. Zhao, S. S. Wang, C. H. Wang, S. T. Wu, W. J. Xu, M. C. Zou, A. Ouyang, A. Y. Cao, Y. B. Li, *Nanoscale* 2016, 8, 626.
[23] C. Zhou, Y. W. Zhang, Y. Y. Li, J. P. Liu, *Nano Lett.* 2013, 13, 2078.
[24] W. Li, F. Gao, X. Wang, N. Zhang, M. Ma, *Angew. Chemie Int. Ed.* 2016, 55, 9196.
[25] D. F. Zeigler, S. L. Candelaria, K. A. Mazzio, T. R. Martin, E. Uchaker, S. L. Suraru, L. J. Kang, G. Z. Cao, C. K. Luscombe, *Macromolecules* 2015, 48, 5196.
[26] G.-F. Chen, X.-X. Li, L.-Y. Zhang, N. Li, T. Y. Ma, Z.-Q. Liu, *Adv. Mater.* 2016, 28, 7680.
[27] D. Vonlanthen, P. Lazarev, K. A. See, F. Wudl, A. J. Heeger, *Adv. Mater.* 2014, 26, 5095.
[28] A. Asatekin, K. K. Gleason, *Nano Lett.* 2011, 11, 677.
[29] M. Wang, X. Wang, P. Moni, A. Liu, D. H. Kim, W. J. Jo, H. Sojoudi, K. K. Gleason, *Adv. Mater.* 2017, 29, 1604606.
[30] A. M. Coclite, R. M. Howden, D. C. Borrelli, C. D. Petruczok, R. Yang, J. L. Yagüe, A. Ugur, N. Chen, S. Lee, W. J. Jo, others, *Adv. Mater.* 2013, 25, 5392.
[31] K. Chan, K. K. Gleason, *Langmuir* 2005, 21, 8930.
[32] W. D. Tian, X. W. Mao, P. Brown, G. C. Rutledge, T. A. Hatton, *Adv. Funct. Mater.* 2015, 25, 4803.
[33] X. Mao, E. H. Yan, G. C. Rutledge, T. A. Hatton, *Chem. Mater.* 2016, 28, 543.
[34] R. Pietschnig, *Chem. Soc. Rev.* 2016, 45, 5216.
[35] X. Mao, W. Tian, J. Wu, G. C. Rutledge, T. A. Hatton, *J. Am. Chem. Soc.* 2015, 137, 1348.
[36] J. L. Yague, K. K. Gleason, *Soft Matter* 2012, 8, 2890.
[37] C. Zhong, Y. Deng, W. Hu, J. Qiao, L. Zhang, J. Zhang, *Chem. Soc. Rev.* 2015, 44, 7484.
[38] M. E. G. Lyons, in *Adv. Chem. Phys.* (Eds.: I. Prigogine, S. A. Rice), John Wiley & Sons, Inc., 1996, pp. 297-624.
[39] C. Gabrielli, H. Perrot, in *Mod. Asp. Electrochem. No. 44 Model. Numer. Simulations II* (Ed.: M. Schlesinger), Springer, New York, N.Y., 2009, pp. 151-238.
[40] A. J. Bard, L. R. Faulkner, *Electrochemical Methods: Fundamentals and Applications*, John Wiley & Sons, Inc., New York, N.Y., 2001.
[41] A. Merz, A. J. Bard, *J. Am. Chem. Soc.* 1978, 100, 3222.
[42] P. J. Peerce, A. J. Bard, *J. Electroanal. Chem. Interfacial Electrochem.* 1980, 114, 89.
[43] X. Zhang, L. Wang, J. Peng, P. Cao, X. Cai, J. Li, M. Zhai, *Adv. Mater. Interfaces* 2015, 2, 1500267.
[44] X. W. Mao, G. C. Rutledge, T. A. Hatton, *Langmuir* 2013, 29, 9626.

INCORPORATION BY REFERENCE

All U.S. and PCT patent application publications and U.S. patents mentioned herein are hereby incorporated by reference in their entirety as if each individual publication or patent was specifically and individually indicated to be incorporated by reference.

EQUIVALENTS

While specific embodiments of the subject invention have been discussed, the above specification is illustrative and not restrictive. Many variations of the invention will become apparent to those skilled in the art upon review of this specification and the claims below. The full scope of the invention should be determined by reference to the claims, along with their full scope of equivalents, and the specification, along with such variations.

The invention claimed is:

1. A composition, comprising:
an electroactive polymer; and a crosslinked polymer;
wherein the crosslinked polymer comprises a first polymeric unit and a second polymeric unit; the first polymeric unit is 2-hydroxyethyl methacrylate and the second polymeric unit is di(ethylene glycol) divinyl ether; the crosslinked polymer coats a surface of the electroactive polymer; and the crosslinked polymer forms a hydrogel on contact with an aqueous solution.

2. The composition of claim 1, wherein the electroactive polymer is a redox polymer.

3. The composition of claim 1, wherein the electroactive polymer is poly(vinylferrocene) (PVF).

4. The composition of claim 1, wherein the electroactive polymer comprises a conjugated backbone.

5. The composition of claim 1, wherein the electroactive polymer is polypyrrole (PPY).

6. The composition of claim 1, wherein the electroactive polymer comprises a plurality of microstructures or a plurality of nanostructures.

7. The composition of claim 1, wherein the crosslinked polymer is deposited on the surface of the electroactive polymer via an initiated chemical vapor deposition process.

8. The composition of claim 1, wherein the crosslinked polymer has a swelling ratio of 1.25 to 1.75.

9. A supercapacitor, comprising a composition of claim 1.

10. A method for forming the composition of claim 1, comprising the step of:
depositing the crosslinked polymer on a surface of the electroactive polymer; thereby forming a modified electroactive polymer;
wherein the crosslinked polymer forms a hydrogel on contact with an aqueous electrolyte solution; and the performance stability of the modified electroactive polymer is improved relative to the performance stability of the electroactive polymer.

11. The method of claim 10, wherein the crosslinked polymer is deposited on the surface of the electroactive polymer via an initiated chemical vapor deposition (iCVD) process.

12. The method of claim 10, wherein the electroactive polymer is a redox polymer.

13. The method of claim 10, wherein the electroactive polymer is poly(vinylferrocene) (PVF).

14. The method of claim 10, wherein the electroactive polymer is polypyrrole (PPY).

* * * * *